(12) United States Patent
Iwanaga et al.

(10) Patent No.: US 9,296,848 B2
(45) Date of Patent: Mar. 29, 2016

(54) POLYMER MATERIAL, SOLAR CELL USING THE SAME, AND SOLAR PHOTOVOLTAIC GENERATION SYSTEM

(75) Inventors: Hiroki Iwanaga, Yokohama (JP); Fumihiko Aiga, Yokohama (JP); Masahiro Hosoya, Okegawa (JP); Mitsunaga Saito, Inzai (JP); Haruhi Oooka, Kawasaki (JP); Akihiko Ono, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 13/429,653

(22) Filed: Mar. 26, 2012

(65) Prior Publication Data

US 2012/0248878 A1 Oct. 4, 2012

(30) Foreign Application Priority Data

Mar. 29, 2011 (JP) ................................ 2011-073426

(51) Int. Cl.
| | | |
|---|---|---|
| *C08G 75/00* | (2006.01) | |
| *C08F 228/06* | (2006.01) | |
| *H01L 51/00* | (2006.01) | |
| *B82Y 10/00* | (2011.01) | |
| *H01L 51/42* | (2006.01) | |

(52) U.S. Cl.
CPC ............ *C08F 228/06* (2013.01); *B82Y 10/00* (2013.01); *H01L 51/0036* (2013.01); *H01L 51/0039* (2013.01); *H01L 51/0037* (2013.01); *H01L 51/0046* (2013.01); *H01L 51/4253* (2013.01); *Y02E 10/549* (2013.01); *Y10T 307/696* (2015.04)

(58) Field of Classification Search
CPC ............ H01L 51/0036; H01L 51/0039; H01L 51/4253
USPC ........... 528/377, 380; 136/263; 252/511, 500; 524/589; 526/256; 977/734
See application file for complete search history.

(56) References Cited

U.S. PATENT DOCUMENTS

2011/0272030 A1* 11/2011 Kitazawa et al. ............. 136/263

FOREIGN PATENT DOCUMENTS

| | | |
|---|---|---|
| JP | 62-090984 | 4/1987 |
| JP | 2004-282980 | 10/2004 |
| JP | 2009-267196 | 11/2009 |
| JP | 2010-111649 | 5/2010 |
| JP | 2010-126603 | 6/2010 |
| JP | 2011-144367 | 7/2011 |
| JP | 2012-009814 | 1/2012 |
| WO | 2010084865 | 7/2010 |

OTHER PUBLICATIONS

Blouin, Nicolas, et al., "Toward a Rational Design of Poly(2,7-Carbazole) Derivatives for Solar Cells", Journal of American Chem. Soc., 2008, pp. 732-742.

(Continued)

*Primary Examiner* — Shane Fang
(74) *Attorney, Agent, or Firm* — Amin, Turocy & Watson, LLP

(57) ABSTRACT

According to one embodiment, a polymer material includes two or more different repeating units each containing a quinoxaline backbone. At least one of the repeating units includes a halogen atom.

3 Claims, 1 Drawing Sheet

(56) References Cited

OTHER PUBLICATIONS

Durmus, Asuman, et al., "New, Highly Stable Electrochromic Polymers from 3,4-Ethylenedioxythiophene-Bis-Substituted Quinozalines toward Green Polymeric Materials", Chem. Mater., 2007, 19, pp. 6247-6251.

Liu, Xiangqiang, et al., "A Polymer-Based Ultrasensitive Metal Ion Sensor", Macromolecules, vol. 42, No. 20, 2009, pp. 7634-7637.

Japanese Office Action for Japanese Application No. 2011-073426 mailed on Dec. 4, 2012.

* cited by examiner

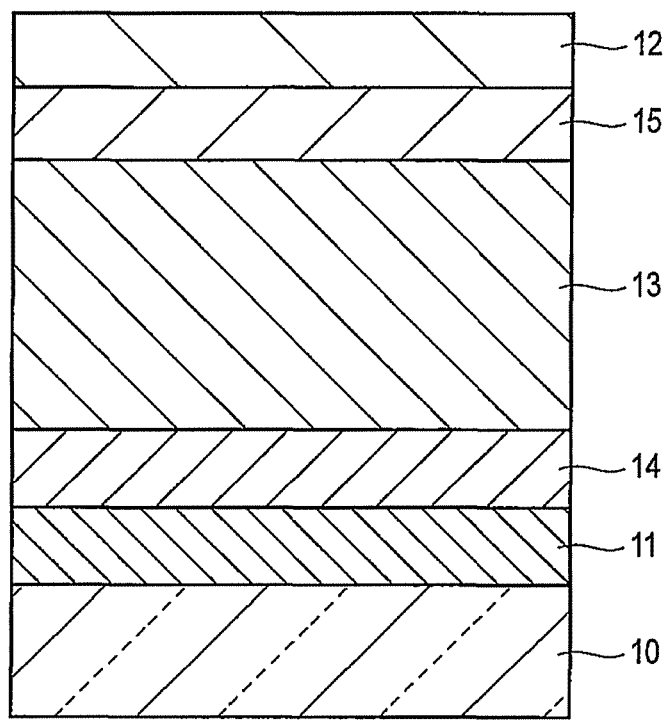

POLYMER MATERIAL, SOLAR CELL USING THE SAME, AND SOLAR PHOTOVOLTAIC GENERATION SYSTEM

CROSS-REFERENCE TO RELATED APPLICATIONS

This application is based upon and claims the benefit of priority from prior Japanese Patent Application No. 2011-073426, filed Mar. 29, 2011, the entire contents of which are incorporated herein by reference.

FIELD

Embodiments described herein relate generally to a polymer material, a solar cell using the same, and a solar photovoltaic generation system.

BACKGROUND

Organic thin-film solar cells can be produced by a non-vacuum process. Thus, they have the advantage that they can be mass-produced at low cost by a simple coating method such as printing, as compared with silicon solar cells, compound semiconductor solar cells, inorganic material-based solar cells such as CIGS type solar cells. If a flexible substrate made of resin, etc. is used, a high degree of design freedom can be achieved due to the flexibility thereof. Because of such characteristics, the organic thin-film solar cell is expected as a next-generation solar cell.

As an early organic thin-film solar cell, a pn-hetero-junction (flat hetero-junction) prototype cell composed of p-type and n-type organic semiconductors has been produced. However, the diffusion length of excitons is as short as around 10 nm. Thus, carriers are generated only in a region of several tens of nanometers from the interface of pn-junction and the conversion efficiency is extremely low. This problem has been resolved by a bulk hetero-junction (BHJ) technology of mixing the p-type organic semiconductor with the n-type organic semiconductor and spreading a pn-junction of nano-order to the whole thin-film. However, it is still difficult to produce an organic thin-film solar cell having sufficient conversion efficiency due to a narrow absorption spectrum width of a p-type organic semiconductor polymer to be used for a photoelectric conversion layer. In order to improve the conversion efficiency, there is a need for development of a new device structure and material.

BRIEF DESCRIPTION OF THE DRAWINGS

The single FIGURE shows a cross-sectional view of a solar cell according to one embodiment.

DETAILED DESCRIPTION

In general, according to one embodiment, a polymer material includes two or more different repeating units each containing a quinoxaline backbone. At least one of the repeating units containing a quinoxaline backbone includes a halogen atom.

Hereinafter, the embodiments will be described.

1. Power Generation Principle of Organic Thin-Film Solar Cell

FIGURE is a cross-sectional view of a bulk hetero-junction solar cell.

The solar cell includes a front electrode 11, a back electrode 12, and a photoelectric conversion layer 13. The solar cell may further include a substrate 10, a hole transport layer 14, and an electron transport layer 15.

The photoelectric conversion process of the organic thin-film solar cell includes the following four steps: a) absorption of light by organic molecules and generation of excitons; b) transfer and diffusion of excitons; c) charge-separation of excitons; and d) charge-transportation to the electrodes.

In the step a), excitons are produced by light absorption by a mixture of p-type and n-type organic semiconductor materials present in the photoelectric conversion layer 13. Subsequently, in the step b), the generated excitons are transferred to the D/A hetero-interface by diffusion. In the step c), the excitons reached at the pn-junction surface are separated into electrons and holes, that is, free carriers. Finally, in the step d), electrons and holes are passed through the electron transport layer 15 and the hole transport layer 14 via the p-type and n-type organic semiconductor materials, are transported to the electrodes 11 and 12, and are taken out by the external circuit.

2. Structural Members of a Solar Cell

Structural members of an organic thin-film solar cell will be described with reference to FIG. 1.

(1) Substrate

A substrate 10 is a substrate for supporting a device. As the material of the substrate, a material which is not altered by heat or organic solvents and has excellent optical transparency is desired. Examples of the material of the substrate include inorganic materials such as alkali-free glass and quartz glass; polymers such as polyethylene, PET, PEN, polyimide, polyamide, polyamidoimide, liquid crystal polymer, and cycloolefin polymer; SUS; silicon; and metal. When an opaque substrate is used, it is preferable that a negative electrode 12 to be described later be transparent or translucent. The substrate 10 desirably has a thickness having sufficient strength to support the element.

(2) Front Electrode

The front electrode 11 is used as a positive electrode herein. The front electrode 11 is stacked on an substrate 10 of the device. The material of the front electrode 11 is not particularly limited as long as it has conductivity. Usually, as the material of the front electrode 11, a transparent or translucent conductive material is used. For example, the front electrode 11 is obtained by forming a film using such a material. Examples of the film formation method include vacuum deposition, spattering, ion-plating, plating, and coating. Examples of the transparent or translucent conductive material include metal oxide and metal. The metal oxide is a film produced using a conductive glass formed of, for example, indium oxide, zinc oxide, tin oxide, and their complexes such as indium stannate (ITO), fluorine-doped tin oxide (FTO), and indium zinc oxide (namely, an NESA film). Examples of the metals include gold, platinum, silver, and copper. As the material of the front electrode 11, an organic conductive polymer, for example, polyaniline, the derivatives thereof, polythiophene, or the derivatives thereof may be used. For example, when ITO is used as the material, the film thickness of the front electrode 11 is preferably from 30 to 300 nm. If the film thickness is smaller than 30 nm, the conductivity is reduced and the resistance is increased, resulting in a decrease in photoelectric conversion efficiency. If the film thickness is larger than 300 nm, the light transmittance may be lowered. If the flexibility is lost and the stress acts, cracks may be produced. The sheet resistance of the front electrode 11 is desired to be low as much as possible. The sheet resistance of the front electrode 11 is, for example, 10Ω/□ or less. The front electrode 11 may be a single layer or laminated layers formed of materials each having a different work function. In order to reduce an electric short circuit with the back electrode 12 and current leaks, it is preferable that the surface be flat.

(3) Hole Transport Layer

The hole transport layer 14 is optionally interposed between the front electrode 11 as a positive electrode and the photoelectric conversion layer 13. The hole transport layer 14 has functions of leveling a concavo-convex part of a lower electrode to prevent the short circuit of the element, of transporting only holes efficiently, and of preventing extinction of excitons generated near the interface of the photoelectric conversion layer 13. Examples of the material of the hole transport layer 14 include polythiophene-based polymers such as PEDOT/PSS (poly(3,4-ethylenedioxythiophene)-poly(styrene sulfonate)); and organic conductive polymers such as polyaniline and polypyrrole. The film formation method of the hole transport layer 14 is not particularly limited as long as it can form a thin film. For example, it is spin-coating. The film thickness of the hole transport layer 14 is, for example, from 20 to 100 nm. When the film thickness is too thin, an activity for preventing the short circuit of a lower electrode is lost; resulting in short-circuits. When the film thickness is too thick, the film resistance is large, the generated electric current is limited, and optical conversion efficiency is reduced.

A method of forming the hole transport layer 14 is not particularly limited as long as it can form a thin film. The method of forming the hole transport layer 14 is, for example, a slit coating method and a meniscus coating method. The hole transport layer 14 is formed, for example, as described below. A solution containing the material of the hole transport layer 14 is applied to form a thin film such that the film has desired thickness. Then, the thin film was heat-dried on a hot plate, etc., preferably, at 140 to 200° C. for about several minutes to 10 minutes. The solution to be applied is desirably pre-filtered with a filter.

(4) Photoelectric Conversion Layer

The photoelectric conversion layer 13 is interposed between the positive electrode 11 and a negative electrode 12 explained below. Taking a bulk hetero-junction organic thin-film solar cell as an example, the photoelectric conversion layer 13 will be described in detail below. The photoelectric conversion layer 13 of the bulk hetero-junction organic thin-film solar cell has a micro phase separation structure in which a p-type organic semiconductor is mixed with an n-type organic semiconductor in the layer.

As a material of the p-type organic semiconductor, a polymer material according to the embodiments is used.

As a material of the n-type organic semiconductor, fullerene or its derivative is suitably used. The fullerene derivative to be used herein is not particularly limited as long as it has a fullerene backbone. The fullerene derivative is specifically a derivative having $C_{60}$, $C_{70}$, $C_{76}$, $C_{78}$, $C_{84}$, etc. as a basic backbone. In the fullerene derivative, a carbon atom in a fullerene backbone may be modified by arbitrary functional groups, and such functional groups may be bonded to each other to form a ring. The fullerene derivative includes a polymer-bound fullerene. It is preferable to use a fullerene derivative which has a functional group having a high affinity for a solvent and thus being provided with a high solubility to the solvent.

Examples of the functional group in the fullerene derivative include a hydrogen atom, a hydroxyl group, and a halogen atom such as a fluorine atom and a chlorine atom; an alkyl group such as a methyl group and an ethyl group; an alkenyl group such as a vinyl group; cyano group; an alkoxy group such as a methoxy group and an ethoxy group; an aromatic hydrocarbon group such as a phenyl group and a naphthyl group; and an aromatic heterocycle group such as a thienyl group and a pyridyl group. Specific examples of the fullerene derivative include hydrogenated fullerenes such as $C_{60}H_{36}$ and $C_{70}H_{36}$; oxide fullerenes such as $C_{60}$ and $C_{70}$; and fullerene metal complexes.

Among them, 60 PCBM ([6,6]-phenyl-$C_{61}$-butyric acid methyl ester) or 70 PCBM ([6,6]-phenyl-$C_{71}$-butyric-acid methyl ester) is particularly preferable as the fullerene derivative.

For example, $C_{60}$, $C_{70}$, and the derivatives thereof have the following structures.

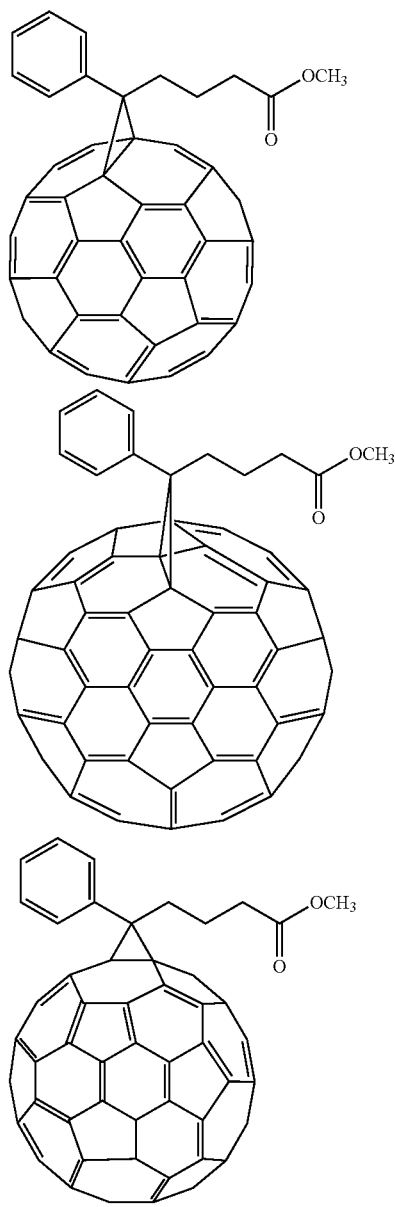

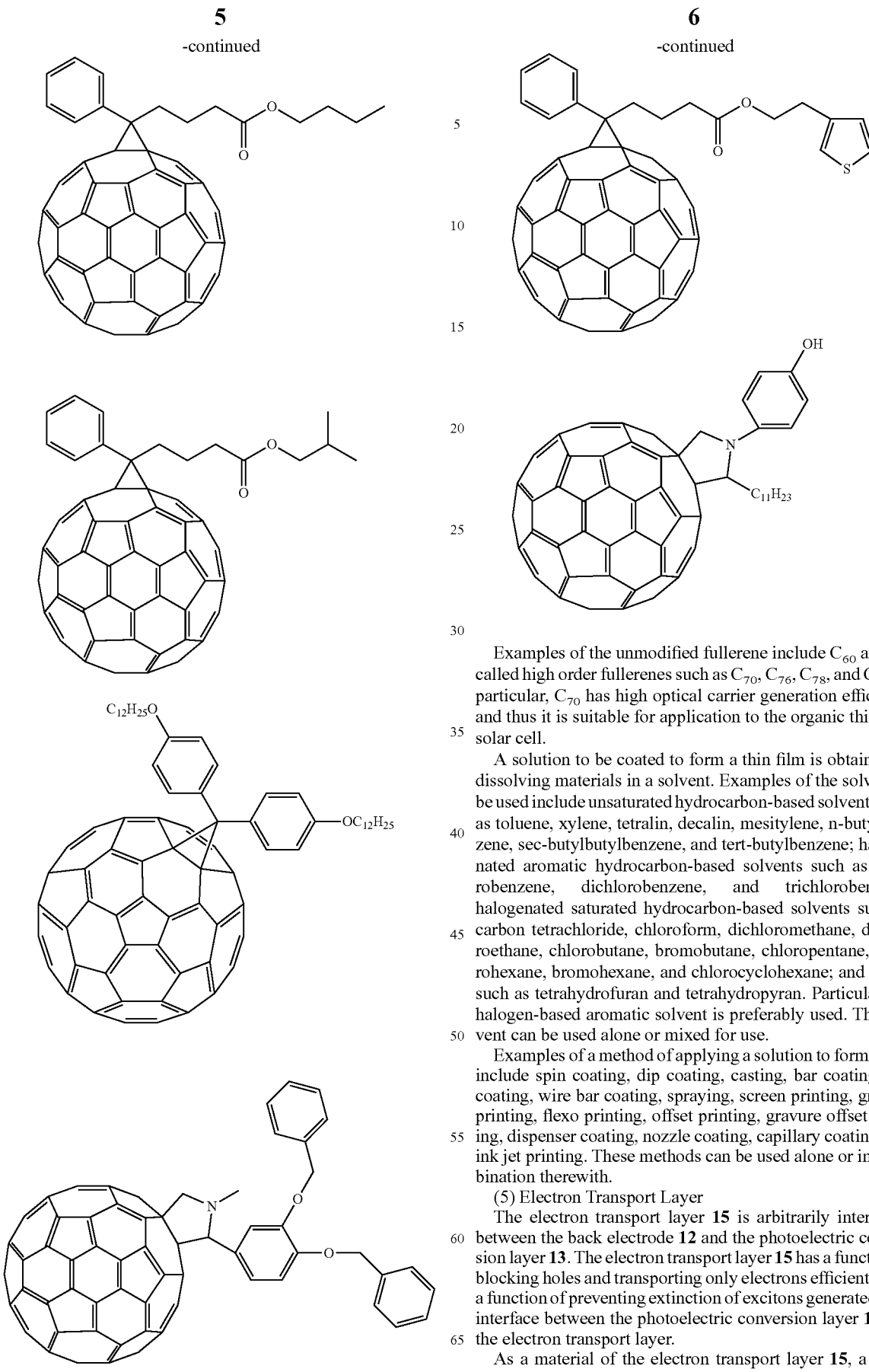

Examples of the unmodified fullerene include $C_{60}$ and so-called high order fullerenes such as $C_{70}$, $C_{76}$, $C_{78}$, and $C_{84}$. In particular, $C_{70}$ has high optical carrier generation efficiency and thus it is suitable for application to the organic thin-film solar cell.

A solution to be coated to form a thin film is obtained by dissolving materials in a solvent. Examples of the solvent to be used include unsaturated hydrocarbon-based solvents such as toluene, xylene, tetralin, decalin, mesitylene, n-butylbenzene, sec-butylbutylbenzene, and tert-butylbenzene; halogenated aromatic hydrocarbon-based solvents such as chlorobenzene, dichlorobenzene, and trichlorobenzene; halogenated saturated hydrocarbon-based solvents such as carbon tetrachloride, chloroform, dichloromethane, dichloroethane, chlorobutane, bromobutane, chloropentane, chlorohexane, bromohexane, and chlorocyclohexane; and ethers such as tetrahydrofuran and tetrahydropyran. Particularly, a halogen-based aromatic solvent is preferably used. The solvent can be used alone or mixed for use.

Examples of a method of applying a solution to form a film include spin coating, dip coating, casting, bar coating, roll coating, wire bar coating, spraying, screen printing, gravure printing, flexo printing, offset printing, gravure offset printing, dispenser coating, nozzle coating, capillary coating, and ink jet printing. These methods can be used alone or in combination therewith.

(5) Electron Transport Layer

The electron transport layer 15 is arbitrarily interposed between the back electrode 12 and the photoelectric conversion layer 13. The electron transport layer 15 has a function of blocking holes and transporting only electrons efficiently and a function of preventing extinction of excitons generated at an interface between the photoelectric conversion layer 13 and the electron transport layer.

As a material of the electron transport layer 15, a metal oxide, for example, an amorphous titanium oxide obtained by hydrolyzing titanium alkoxide by the sol gel process is used. A method for forming a film is not particularly limited as long as it can form a thin film. The method is, for example, spin-coating. When titanium oxide is used as the material of the electron transport layer 15, the film thickness of the electron transport layer 15 is preferably from 5 to 20 nm. When the film thickness is too thin, the hole blocking effect is reduced and thus the generated excitons are deactivated before the excitons dissociate into electrons and holes. Thus, the electric current cannot be taken out efficiently. When the film thickness is too thick, the film resistance is large, the generated electric current is limited, resulting in reduction of optical conversion efficiency. As the solution to be applied for forming a thin film, a solution which is pre-filtered with a filter is desirable. The solution is applied to form a thin film such that the film has a specified thickness, and the film is then heat-dried using a hot plate or the like. The thin film is heat-dried while facilitating hydrolysis in the air at 50 to 100° C. for about several minutes to 10 minutes.

(6) Back Electrode

The back electrode 12 is used as a negative electrode herein. The back electrode 12 is stacked on the photoelectric conversion layer 13 or the electron transport layer 15. A material of the back electrode 12 is not particularly limited as long as it has conductivity. The material of the back electrode 12 is, for example, a conductive metal or metal oxide. The material of the back electrode 12 may be a conductive paste obtained by dispersing fine particles of metal and/or metal oxide in a binder. The material of the back electrode 12 may be polyaniline (i.e., an organic conductive polymer), the derivatives thereof, polythiophene, or the derivatives thereof. When the front electrode 11 is formed using a material having high work function, it is preferable to use material having a low work function for the back electrode 12. Examples of the material having low work function include alkali metal and alkaline earth metal. Specific examples thereof include Li, In, Al, Ca, Mg, Sm, Tb, Yb, Zr, Na, K, Rb, Cs, Ba, and the alloys thereof. For example, a film of the back electrode 12 is formed with use of the above materials. Examples of the usable film formation method include vacuum deposition, spattering, ion-plating, plating, and coating.

The back electrode 12 may be a single layer or laminated layers formed of materials each having a different work function. Further, it may be an alloy of one or more of the materials having a low work function and at least one selected from the group consisting of gold, silver, platinum, copper, manganese, titanium, cobalt, nickel, tungsten, and tin. Examples of the alloy include a lithium-aluminium alloy, a lithium-magnesium alloy, a lithium-indium alloy, a magnesium-silver alloy, a magnesium-indium alloy, a magnesium-aluminium alloy, an indium-silver alloy, and a calcium-aluminium alloy.

The film thickness of the back electrode 12 is from 1 to 1000 nm, preferably from 10 to 500 nm. When the film thickness is smaller than the above range, the resistance is excessively large and the generated charge cannot be sufficiently transmitted to the external circuit. When the film thickness is large, large amounts of the materials are used and thus the occupation time of a film-forming device is long. This leads to cost increase.

(7) Antireflection Film

Since the surface of the substrate reflects light, it is desirable to form an antireflection film for reducing reflection (not shown).

When the antireflection film is provided on both surfaces of the substrate, the maximum effect is exerted. The film may be provided only on one surface.

Examples of a material of the antireflection layer include an inorganic-based material such as titanium oxide; and an organic-based material such as acrylic resin and polycarbonate resin. The antireflection film is formed by a general antireflection coating with use of such materials. Further, for example, the antireflection film is provided by placing a sheet comprised of such materials. The antireflection film has a predetermined thickness or shape.

The antireflection film for a solar cell desirably has a moth-eye type fine protrusion structure. In a film having a protrusion structure, the refractive index in a thickness direction is continuously varied. Thus, there is almost no reflection of light which strikes on the film, so that it is possible to transmit almost all the light.

The moth-eye type fine protrusion structure can be produced by transferring the pattern of a mold having fine concavo-convex portions, produced by nanoimprinting, to a resin sheet, an inorganic SOG film, an organic SOG film, etc.

Further, the moth-eye type fine protrusion structure can be formed by applying, for example, a coating material having an antireflection function based on the same principle as the moth-eye structure by a self-organizing control technique of titanium oxide.

(8) Wavelength Conversion Film

The efficiency is improved by providing a layer which converts a short wavelength component of sunlight to a long wavelength (not shown), namely, a wavelength conversion layer. For example, the photoelectric conversion efficiency is improved by about 10% by providing the wavelength conversion layer obtained by coating the surface of the substrate with a europium complex.

(9) Sealing Process

In order to protect a device from oxygen and moisture, a sealing treatment is performed on the device portion. Then, an extraction electrode is taken out from each electrode, thereby an organic thin-film solar cell is obtained. In the sealing process, a resin film (e.g. PET, PEN, PI, EVOH, CO, EVA, PC, and PES) with glass, a metal plate, an inorganic substance, metal (e.g. silica, titania, zirconia, silicon nitride, boron nitride, and Al) or the like formed on the surface thereof using a heat-curing or UV-curing type epoxy resin as a fixing agent is used to protect the surface. Improvement in the cell life can be expected by applying a drying agent and an oxygen absorbent to the space to be sealed.

3. Polymer Material

The polymer material according to one embodiment includes two or more types of repeating units each containing a quinoxaline backbone and each being different, and at least one of the repeating units containing the quinoxaline backbone includes a halogen atom.

The polymer material is a copolymer. The copolymer may be a block copolymer.

Examples of the quinoxaline backbone are shown below.

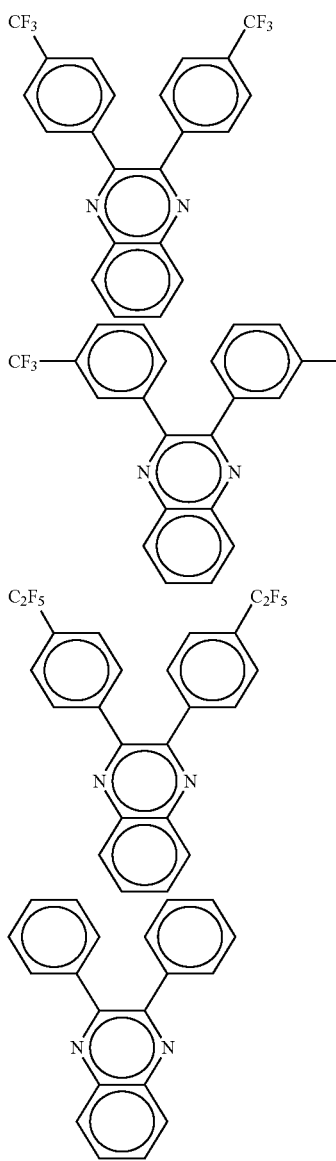

Each of the repeating units containing a quinoxaline backbone is bonded to other repeating units, for example, via carbon atoms at 5th and 8th positions or bonding groups bonded to the carbon atoms at 5th and 8th positions to form a polymer.

In a normal quinoxaline homopolymer, microcrystals are partially produced during forming a thin film, and thus film uniformity and surface smoothness are impaired. Consequently, problems are caused for the conversion efficiency or stability of the organic thin-film solar cell. On the other hand, like the embodiment, the copolymer into which two or more different types of quinoxaline backbones are introduced is more amorphous, and a problem that the microcrystals are produced is not caused. The adjustable range of polymer physical properties can be extended by selecting the type and combination of two or more types of quinoxaline backbones. In addition to the shape of absorption-spectrum and the deepening of the HOMO level, various characteristics such as morphology, dispersibility of the n-type semiconductor such as fullerene, and good joint state of the PEDOT/PSS interface adjacent to the positive electrode are required for the p-type organic semiconductor used for the organic thin-film solar cell. Therefore, adjustment of physical properties in a wide range is advantageous to produce an excellent organic thin-film solar cell.

Particularly, the following copolymer is listed. That is, the copolymer contains a first repeating unit represented by the formula (1) and a second repeating unit represented by the formula (2), each containing a quinoxaline backbone. At least one of the repeating units includes a halogen atom:

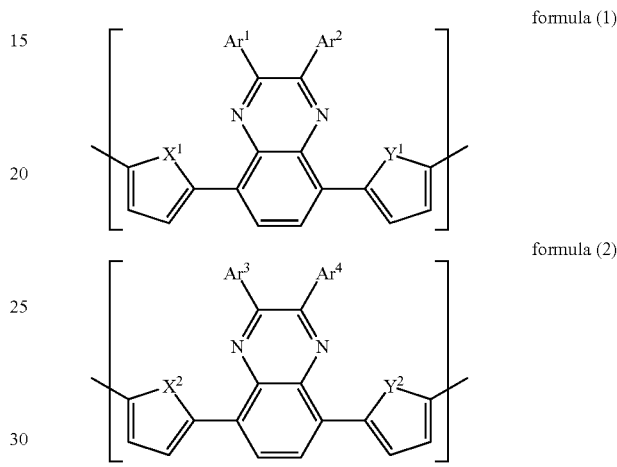

formula (1)

formula (2)

In the formula, $X^1$, $X^2$, $Y^1$, and $Y^2$ may be identically or differently S or Se.

$Ar^1$, $Ar^2$, $Ar^3$, and $Ar^4$ may be identically or differently an aromatic group in which an H atom may be unsubstituted or substituted by a halogen atom or a substituent having a halogen atom. The aromatic group is, for example, a phenyl group and a thienyl group. $Ar^1$, $Ar^2$, $Ar^3$, and $Ar^4$ each are preferably a phenyl group or a phenyl group in which an H atom is substituted by a halogen atom or a substituent having a halogen atom.

Here, the substituent having a halogen atom is a linear or branched alkyl group or an alkoxy group having 1 to 12 carbon atoms, and all or a part of the H atoms thereof may be substituted by halogen. Here, the halogen atom means a fluorine atom, a chlorine atom, a bromine atom, and an iodine atom, and preferably a fluorine atom.

If quinoxaline backbones substituted by aromatic rings represented by $Ar^1$ to $Ar^4$ are introduced into polymers, the HOMO levels are deepened. When these polymers are used for the organic thin-film solar cell, the open circuit voltage is increased. Further, as electron withdrawing properties of the substituent included in the aromatic series are higher, the HOMO levels are largely deepened, resulting in improvement in the open circuit voltage. Therefore, the aromatic rings may be those substituted by a halogen atom or a substituent having a halogen atom, which has a significant effect of deepening the HOMO levels. The use of, particularly, a quinoxaline backbone substituted by an aromatic ring having a substituent with a fluorine atom is effective in improving the conversion efficiency.

The most preferred substituent having a halogen atom is perfluoroalkyl from the viewpoint of electron withdrawing properties.

Further, a quinoxaline portion having electron-accepting properties absorbs light due to the electron transfer from a thienyl portion having electron-donative properties (when X or Y represents S) and/or a selenyl portion (when X or Y represents Se). This mechanism is called "intramolecular-charge-transfer (CT) absorption system". When a thienyl portion and/or a selenyl portion are/is included, an absorption wavelength region can be extended.

The weight average molecular weight (Mw) of the copolymer is 20,000 or more, preferably 40,000 or more, more preferably 50,000 or more, still more preferably 100,000 or more. As the weight average molecular weight of the copolymer is larger, the value of resistance is lowered and the number of times of carrier hopping is decreased. Thus, the conversion efficiency is increased when applied to the organic thin-film solar cell. The weight ratio of the first repeating unit and the second repeating unit included in the copolymer is arbitrary. For example, it is 5:95 to 95:5, preferably 10:90 to 90:10.

A polymer material according to another embodiment is a polymer containing the repeating unit represented by the formula (3).

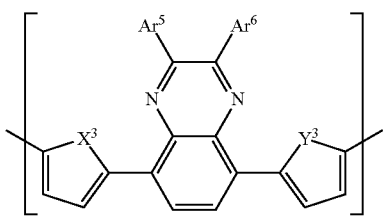

formula (3)

$X^3$ and $Y^3$ may be identically or differently S or Se.

$Ar^5$ and $Ar^6$ may be the same or different. At least one of $Ar^5$ and $Ar^6$ is an aromatic group in which an H atom is substituted by a halogen atom or a substituent having a halogen atom. The aromatic group is, for example, a phenyl group and a thienyl group. That is, $Ar^5$ and $Ar^6$ each are, for example, a phenyl group, a substituted phenyl group, a thienyl group, and a substituted thienyl group. $Ar^5$ and $Ar^6$ each are preferably a phenyl group or a phenyl group in which an H atom is substituted by a halogen atom or a substituent having a halogen atom.

The substituent having a halogen atom is, for example, a linear or branched alkyl group and an alkoxy group, and all or a part of the H atoms may be substituted by halogen. Here, the halogen atom means a fluorine atom, a chlorine atom, a bromine atom, and an iodine atom, and preferably a fluorine atom.

As described above, the conversion efficiency is improved by the aromatic ring having a halogen atom. Additionally, the aromatic ring conjugated with the quinoxaline backbone has an effect of shifting the absorption spectrum to a longer wavelength side by the extension of the conjugated system. Further, the effect by the extension of the conjugated system can be significantly improved by introducing a fluorine atom or a substituent having a fluorine atom, which is an electron withdrawing group. As the substituent having a fluorine atom, a perfluoroalkyl group is preferred from the viewpoint of the electron withdrawing properties. Here, the perfluoroalkyl group has, for example, 1 to 12 carbon atoms. A halogen atom or a substituent containing a halogen atom is preferably introduced into a para-position.

The polymer material may be a homopolymer or a copolymer. When the polymer material is a copolymer, it contains a repeating unit other than the repeating unit represented by the formula (3). The repeating unit other than the repeating unit represented by the formula (3) is, for example, carbazole, fluorene, or substitution products thereof, or condensed heterocyclics such as benzothiophene and thienothiophene. These repeating units may be bonded to the quinoxaline skeleton via the heterocycle having $X^3$ or $Y^3$ or be bonded directly to the quinoxaline skeleton. When the polymer material is a copolymer, the ratio of the repeating unit represented by the formula (3) included in the copolymer is 5 to 95% by mass.

The polymer material may be a block polymer.

The weight average molecular weight (Mw) of the polymer is 20,000 or more, preferably 40,000 or more, more preferably 50,000 or more, still more preferably 100,000 or more.

A polymer according to a further embodiment is a polymer containing a repeating unit represented by formula (4).

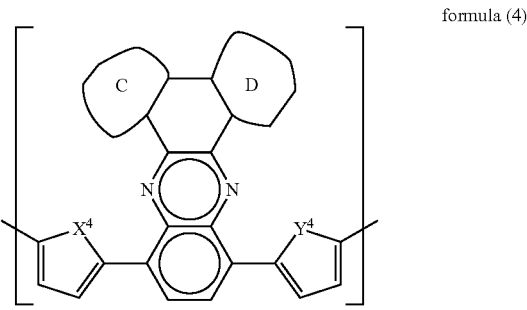

formula (4)

$X^4$ and $Y^4$ may be identically or differently S or Se.

C and D may be identically or differently an aromatic ring. C and D each are, for example, a phenyl group, a substituted phenyl group, a thienyl group, a substituted thienyl group, and a selenophene group. Preferably, C and D each are a phenyl group or a substituted phenyl group. Here, a substituent which substitutes the phenyl group or the thienyl group is, for example, a fluoroalkyl group, an alkyl group, an alkoxy group and an amino group.

In the polymer material, the electron withdrawing effect is expressed by introducing a condensed ring instead of introducing a halogen atom. Further, a π-conjugated system is extended by introduction of the condensed ring, and thus the absorption wavelength region can be extended.

The polymer material may be a homopolymer or a copolymer. When the polymer material is a copolymer, it contains a repeating unit other than the repeating unit represented by the formula (4). The repeating unit other than the repeating unit represented by the formula (4) is, for example, carbazole, fluorene, or substitution products thereof, or condensed heterocyclics such as benzothiophene and thienothiophene. These repeating units may be bonded to the quinoxaline skeleton via the heterocycle having $X^4$ or $Y^4$ or be bonded directly to the quinoxaline skeleton. When the polymer material is a copolymer, the ratio of the repeating unit represented by the formula (4) included in the copolymer is 5 or 95% by mass.

The polymer material may be a block polymer.

The weight average molecular weight (Mw) of the polymer is 20,000 or more, preferably 40,000 or more, more preferably 50,000 or more, still more preferably 100,000 or more.

A polymer material according to a further embodiment is a mixture of at least two polymers selected from the group consisting of the above polymer materials.

The mixture may be a block polymer.

The mixture may contain at least two of the polymers at an arbitrary weight ratio. For example, when the mixture is those of two polymers, it contains these polymers at a weight ratio of 5:95 to 95:5.

The mixture according to a still further embodiment is a mixture of two or more selected from the group consisting of known polymers and the above polymers. For example, it is a mixture of a polymer containing the repeating unit represented by the formula (3) and a known polymer containing a repeating unit represented by formula (5) below.

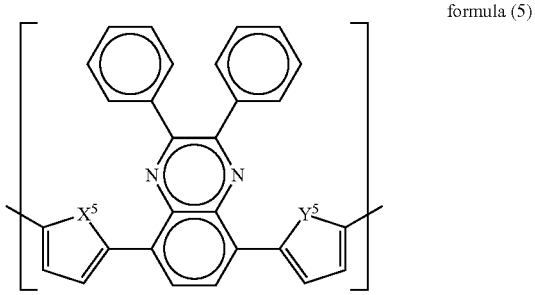

formula (5)

$X^5$ and $Y^5$ may be identically or differently S or Se.

As long as the photoelectric conversion rate is improved, these polymers may be mixed at an arbitrary weight ratio. For example, a ratio of a polymer containing the repeating unit represented by the formula (3) to a polymer containing the repeating unit represented by the formula (5) may be an arbitrary weight ratio. The polymers may be mixed, for example, at a weight ratio of 1:9 to 9:1, preferably a weight ratio of 1:9 to 5:5.

The repeating unit represented by the formula (5) may further contain carbazole, a carbazole derivative, fluorene or a fluorene derivative.

The mixture may be used for the photoelectric conversion layer of the photovoltaic cell as a p-type semiconductor material.

A polymer material according to a further embodiment is a copolymer which includes the first repeating unit represented by the formula (6) and the second repeating unit represented by formula (7).

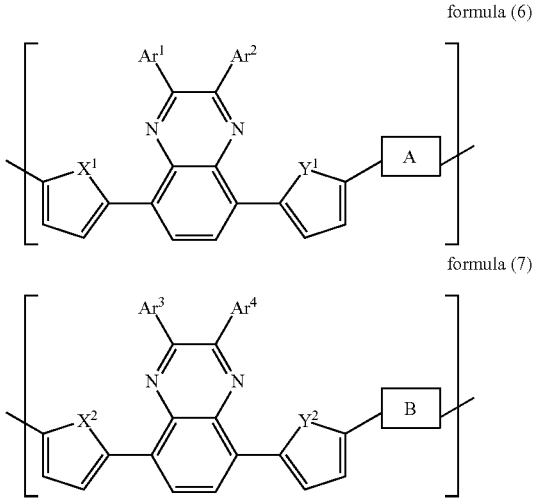

formula (6)

formula (7)

$X^1, X^2, Y^1$, and $Y^2$ may be identically or differently S or Se.
$Ar^1, Ar^2, Ar^3$, and $Ar^4$ may be identically or differently an aromatic group in which an H atom may be unsubstituted or substituted by a halogen atom or a substituent having a halogen atom. The aromatic group is, for example, a phenyl group and a thienyl group. $Ar^1, Ar^2, Ar^3$, and $Ar^4$ each are preferably a phenyl group or a phenyl group in which an H atom is substituted by a halogen atom or a substituent having a halogen atom.

The substituent having a halogen atom is, for example, a linear or branched alkyl group and an alkoxy group, and all or a part of the H atoms thereof may be substituted by halogen. Here, the halogen atom means a fluorine atom, a chlorine atom, a bromine atom, and an iodine atom, preferably a fluorine atom.

A and B may be identically or differently carbazole, a carbazole derivative, fluorene or a fluorene derivative.

The copolymer may be a block copolymer.

The weight average molecular weight (Mw) of the copolymer is 20,000 or more, preferably 40,000 or more, more preferably 50,000 or more, still more preferably 100,000 or more.

A polymer material according to a further embodiment is a polymer containing a repeating unit represented by formula (8).

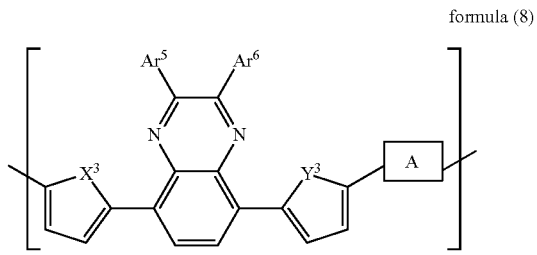

formula (8)

$X^3$ and $Y^3$ may be identically or differently S or Se.

$Ar^5$ and $Ar^6$ may be the same or different. At least one of $Ar^5$ and $Ar^6$ is an aromatic group in which an H atom is substituted by a halogen atom or a substituent having a halogen atom. The aromatic group is a phenyl group or a thienyl group, for example. The substituent having a halogen atom is, for example, a linear or branched alkyl group and an alkoxy group, and all or a part of the H atoms may be substituted by halogen. Here, the halogen atom means a fluorine atom, a chlorine atom, a bromine atom, and an iodine atom, preferably a fluorine atom.

A is carbazole, a carbazole derivative, fluorene or a fluorene derivative.

The polymer material may be a homopolymer or a copolymer. When the polymer material is a copolymer, it contains a repeating unit other than the repeating unit represented by the formula (8). When the polymer material is a copolymer, the ratio of the repeating unit represented by the formula (8) included in the copolymer is 5 to 95% by mass.

The polymer material may be a block polymer.

The weight average molecular weight (Mw) of the polymer is 20,000 or more, preferably 40,000 or more, more preferably 50,000 or more, still more preferably 100,000 or more.

A polymer according to a further embodiment is a polymer containing a repeating unit represented by formula (9).

formula (9)

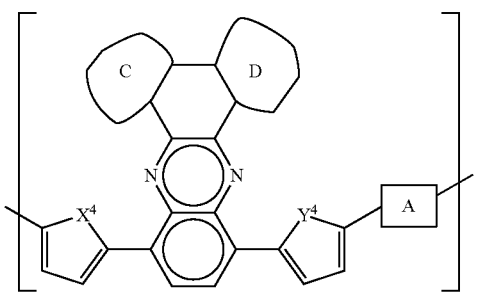

$X^4$ and $Y^4$ may be the same or different and are S or Se.

A is carbazole, a carbazole derivative, fluorene or a fluorene derivative.

C and D may be identically or differently an aromatic ring. C and D each are, for example, a phenyl group, a substituted phenyl group, a thienyl group, and a substituted thienyl group. Preferably, C and D each are a phenyl group or a substituted phenyl group.

The carbazole derivative and the fluorene derivative are represented by, for example, the chemical formulae (10) and (11) below.

formula (10)

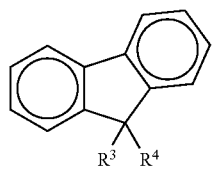

formula (11)

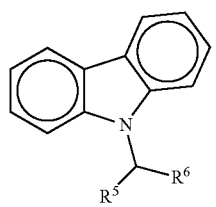

In the formula, $R^3$, $R^4$, $R^5$, and $R^6$ may be identically or differently a linear or branched alkyl group or an alkoxy group having 1 to 12 C atoms.

Carbazole, fluorene, a carbazole derivative or a fluorene derivative is bonded to thienyl of a repeating unit or a selenyl portion, and the polymerization reaction of the polymer can be improved and the weight average molecular weight can be increased.

The polymer material may be a homopolymer or a copolymer. When the polymer material is a copolymer, it contains a repeating unit other than the repeating unit represented by the formula (9). When the polymer material is a copolymer, the ratio of the repeating unit represented by the formula (9) included in the copolymer is 5 to 95% by mass.

The polymer material may be a block polymer.

The weight average molecular weight (Mw) is 20,000 or more, preferably 40,000 or more, more preferably 50,000 or more, still more preferably 100,000 or more.

A polymer material according to a further embodiment is a mixture of two or more selected from the group consisting of known polymers and the above polymers. The known polymer is, for example, a polymer containing the repeating unit of the formula (5). Here, the repeating unit represented by the formula (5) may further contain carbazole, a carbazole derivative, fluorene or a fluorene derivative.

As long as the photoelectric conversion rate is improved, these polymers may be mixed at an arbitrary weight ratio. The polymers may be mixed, for example, at a weight ratio of 1:9 to 9:1, preferably a weight ratio of 1:9 to 5:5.

The mixture may be used for the photoelectric conversion layer of the photovoltaic cell as a p-type semiconductor material.

According to a further embodiment, there is provided a solar cell which comprises a positive electrode, a negative electrode, and the photoelectric conversion layer 13 which is interposed between the positive electrode and the negative electrode and contains at least one compound selected from the group consisting of the copolymer, the polymer, and the mixture. The copolymer, the polymer, or the mixture may be used for the photoelectric conversion layer 13 as a p-type-semiconductor material.

According to a further embodiment, there is provided a solar photovoltaic generation system which includes an inverter which converts a DC power output from the solar cell into an AC power, and a storage cell which stores at least a part of an excessive amount of power when the electric power output from the solar cell exceeds user's power consumption, and outputs the stored electric power when the electric power output from the solar cell is below the user's power consumption. The solar photovoltaic generation system may further comprise a power line for supplying an AC power to the user.

EXAMPLES

<1> Synthesis of Quinoxaline Backbone (1)

A quinoxaline backbone was synthesized by the following processes according to the methods described in Chemistry of Materials, 19(25), 6247-6251 (2007) and Macromolecules, 42(20), and 7634-7637 (2009).

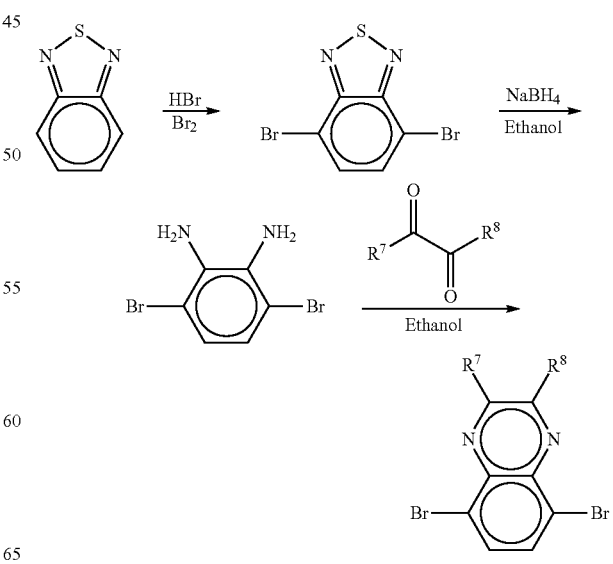

<2> Synthesis of Quinoxaline Backbone (2)
A quinoxaline backbone was synthesized by the following processes according to the methods described in Chemistry of Materials, 19(25), 6247-6251 (2007) and Macromolecules, 42 (20), 7634-7637 (2009).
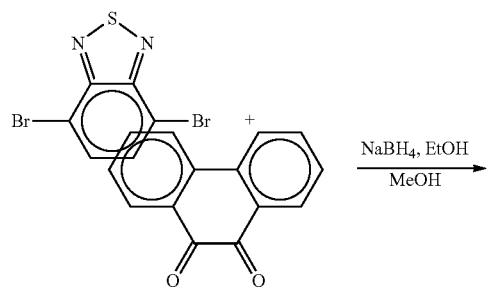
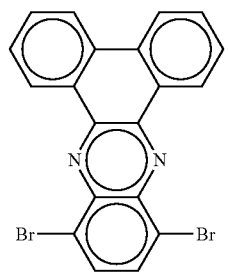
Synthesis of repeating units according to Examples and Comparative examples to be described below was performed by the processes below with reference to J. Am. Chem. Soc. 130, 732 (2008).
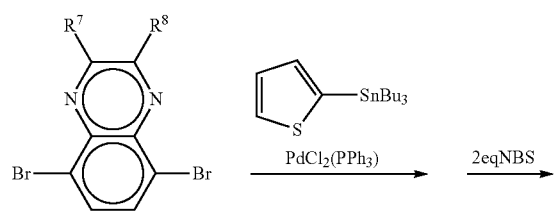
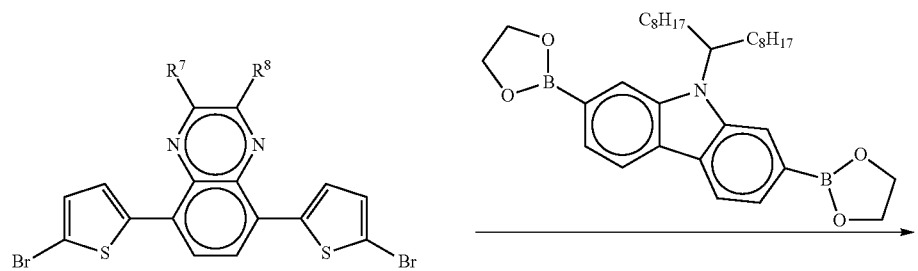
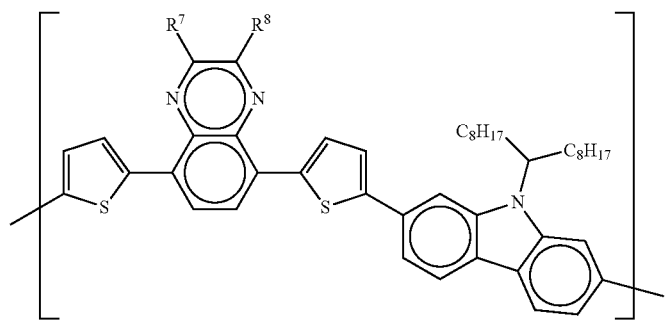

Example 1
A copolymer was synthesized according to the following process.
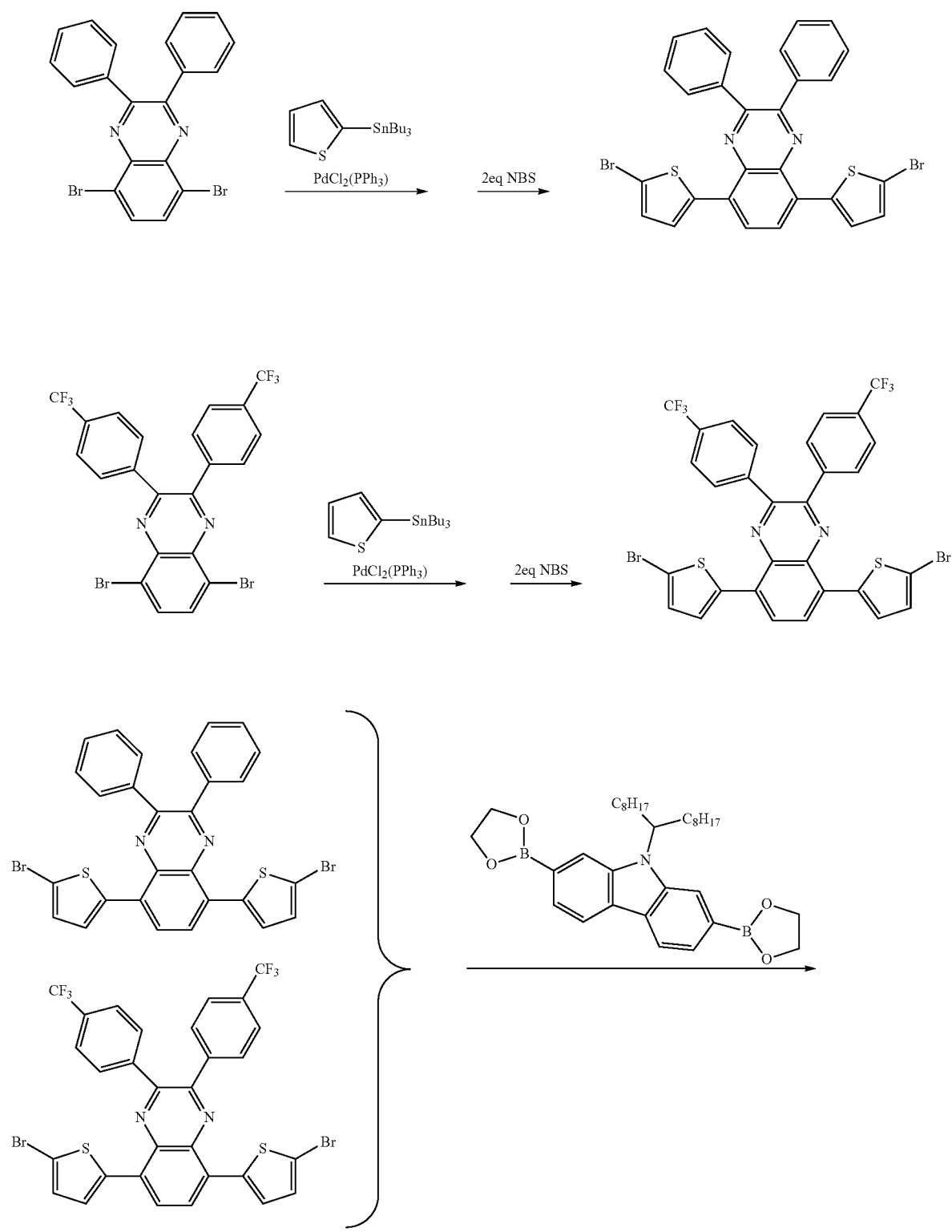

-continued

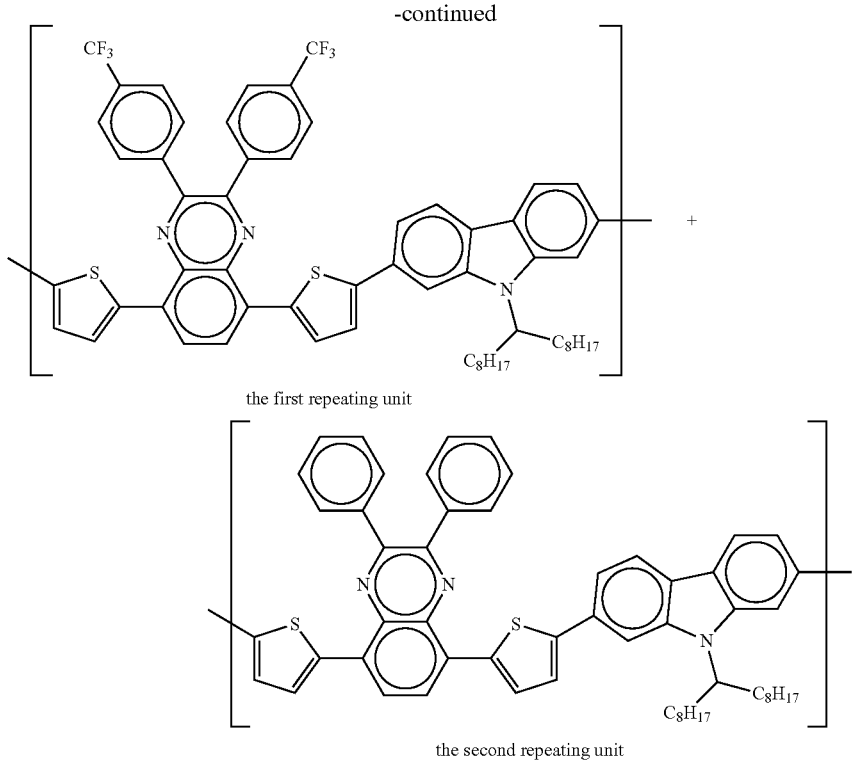

the first repeating unit the second repeating unit

The copolymer was synthesized by mixing a quinoxaline backbone having a trifluoromethyl group with another quinoxaline backbone and simultaneously reacting them.

The weight average molecular weight (Mw) was 41,000, and the weight average molecular weight (Mw)/the number average molecular weight (Mn) was 1.14.

Example 2

A polymer was synthesized according to the following process.

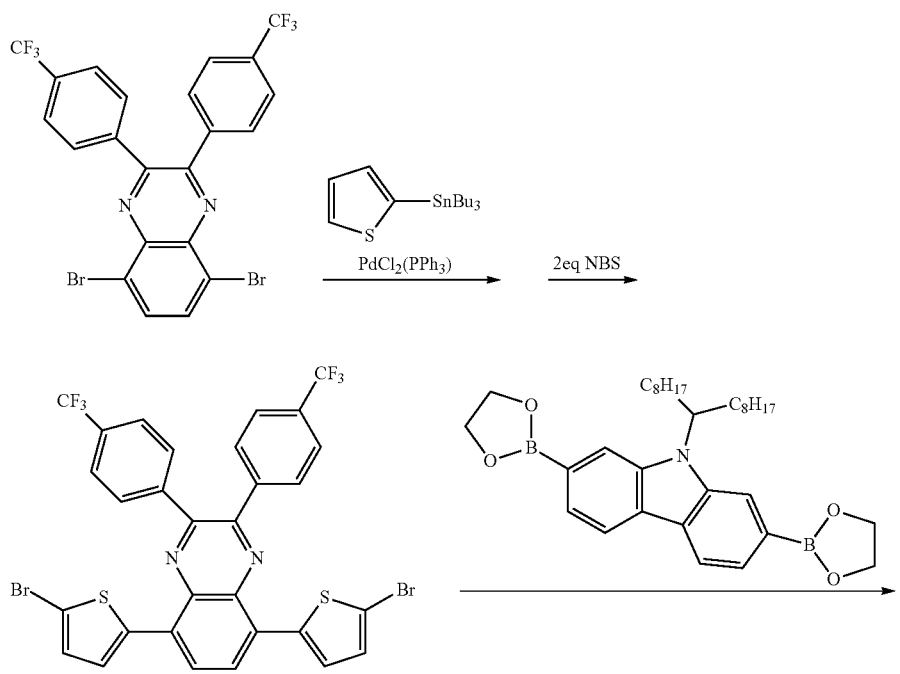

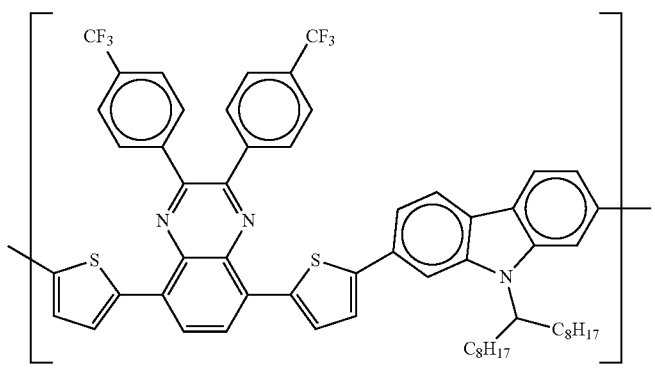
Mw was 140,000, and Mw/Mn was 1.8.
Example 3
A polymer was synthesized according to the following process.
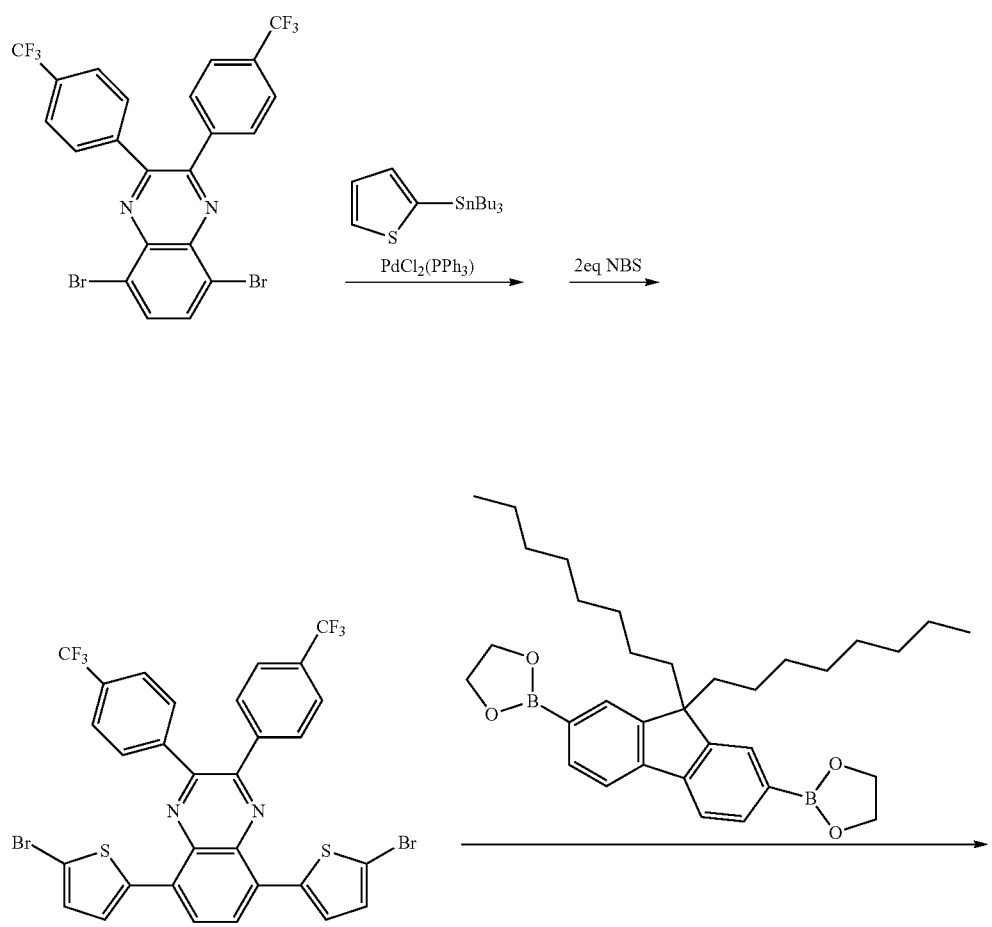

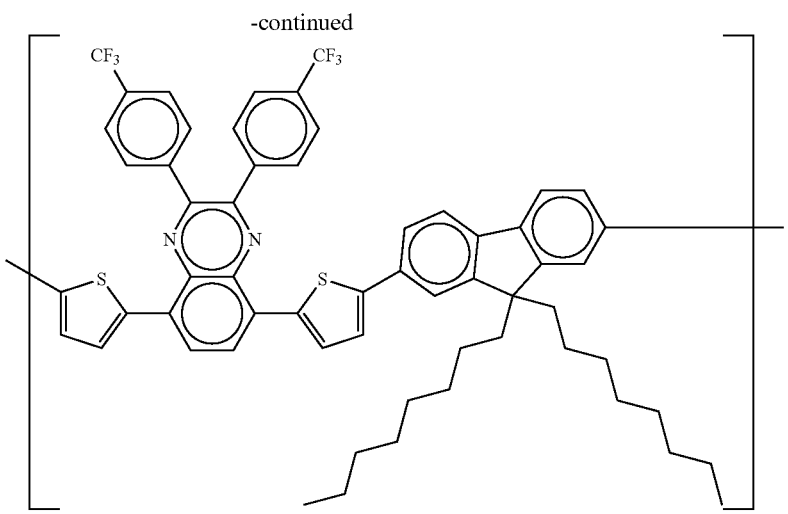
Mw was 24,600, and Mw/Mn was 1.5.
Example 4
A polymer was synthesized according to the following process.
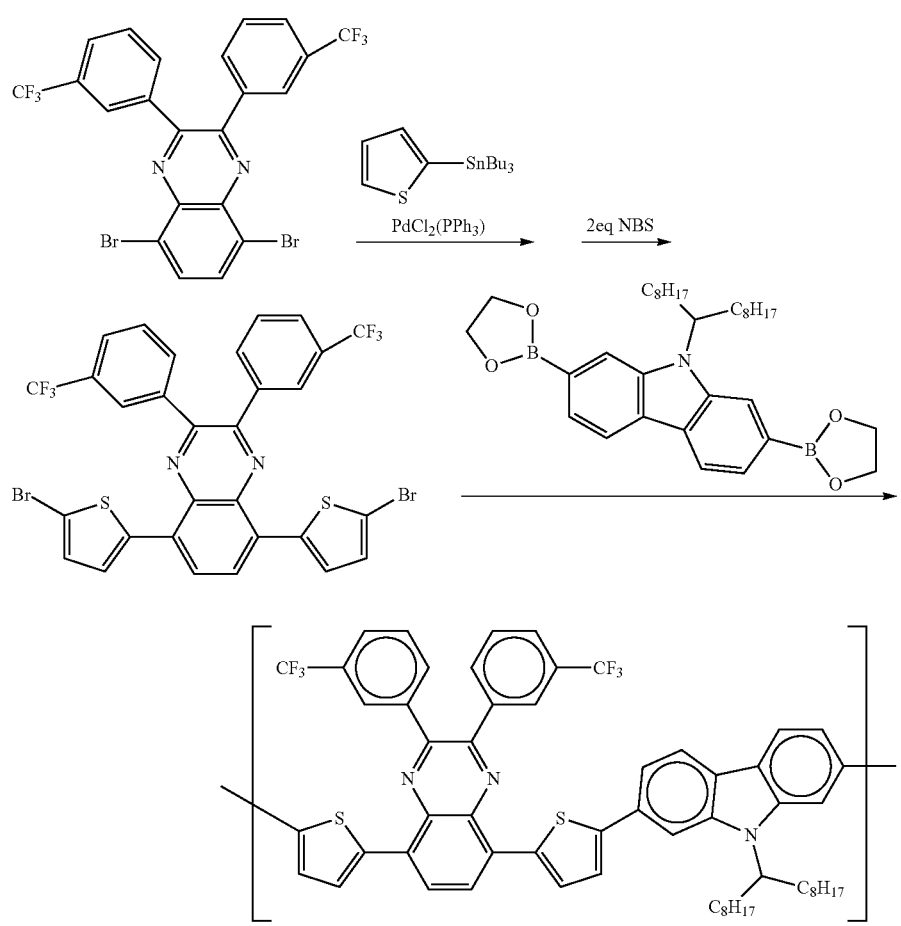
Mw was 17,700, and Mw/Mn was 1.8.

Example 5
A polymer was synthesized according to the following process.
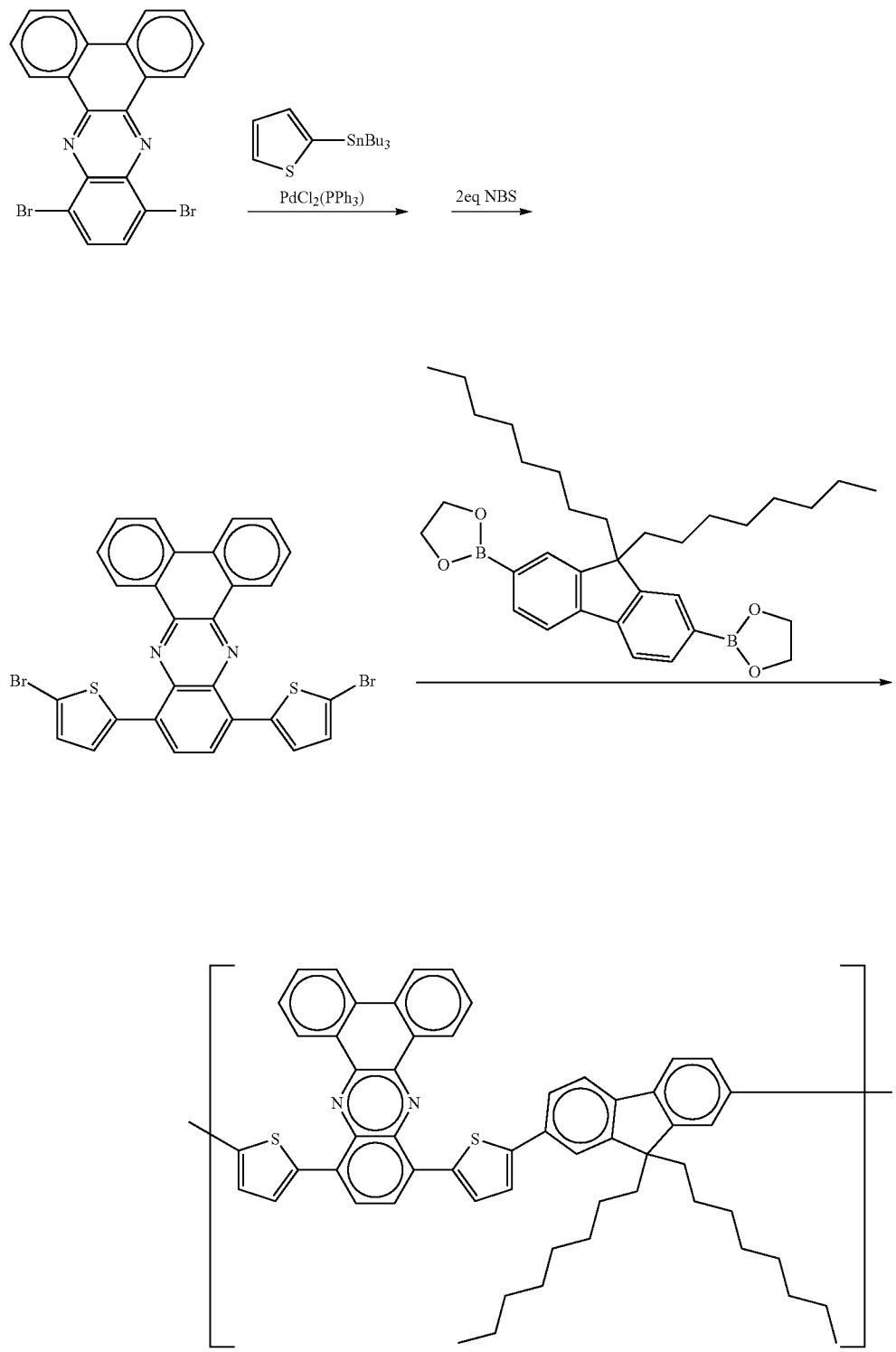
Mw/Mn was 1.7.

Example 6
A polymer was synthesized according to the following process.
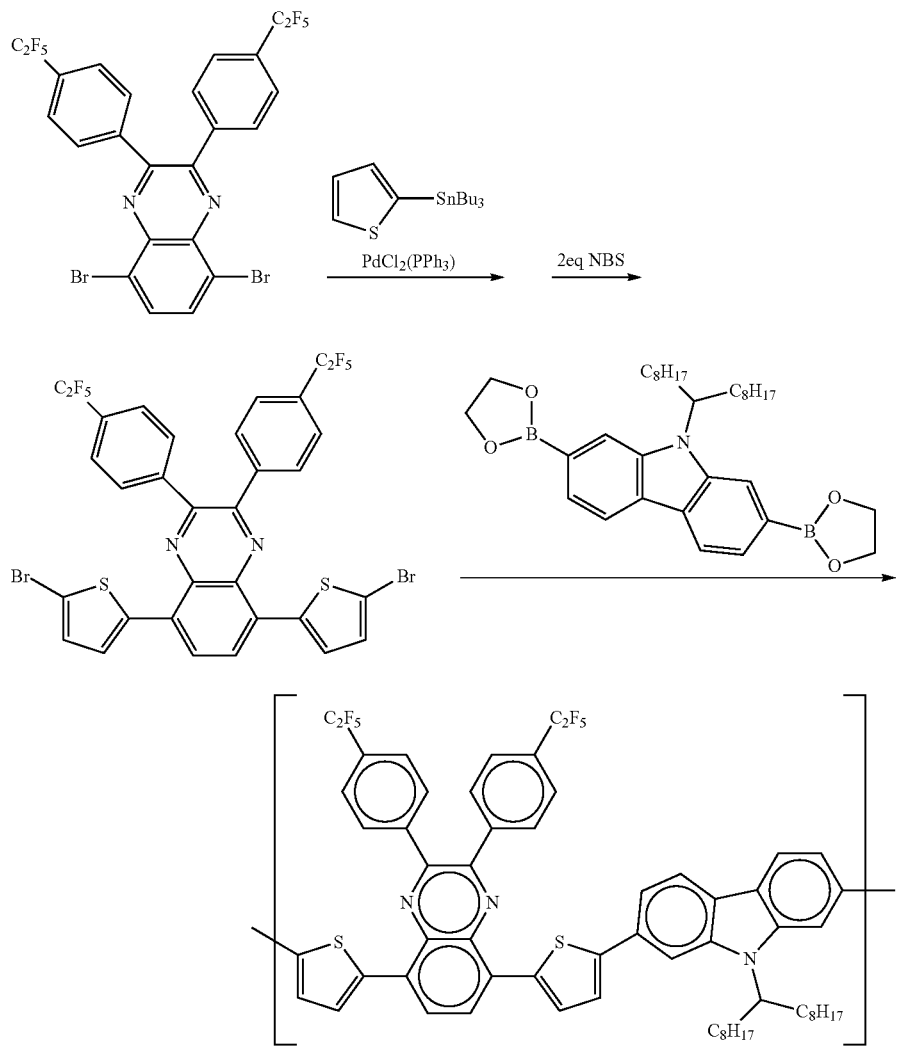
Mw was 27,500 and Mw/Mn was 1.9.
Comparative Example 1
A polymer was synthesized according to the following process.
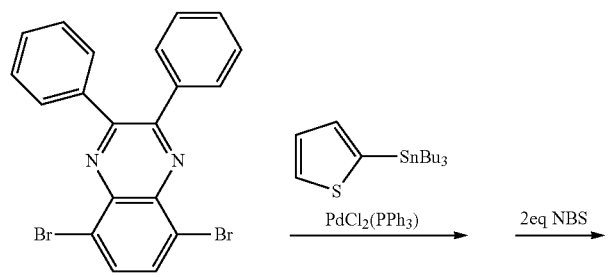

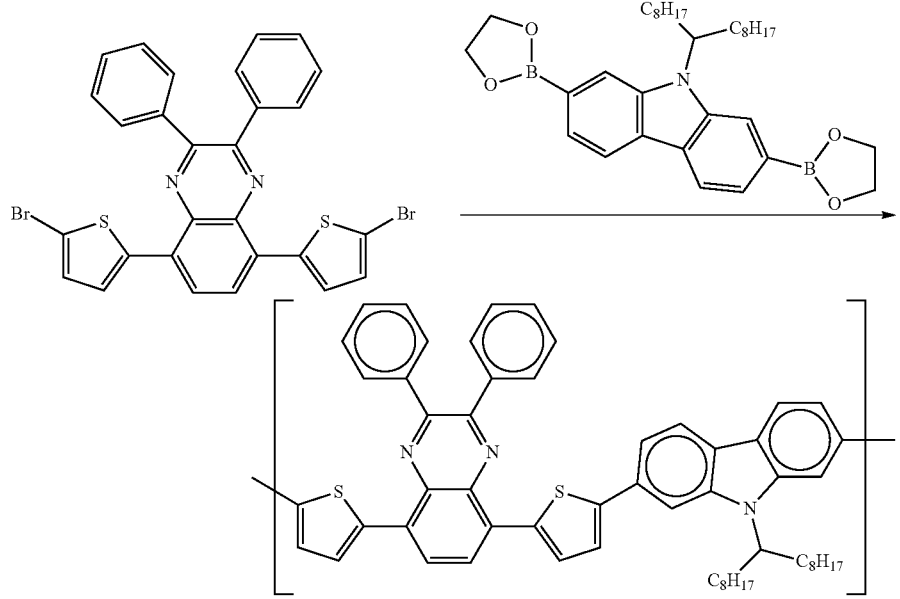

Mw was 44,000, and Mw/Mn was 1.9.

<3> Production of a Solar Cell Using a Polymer Having a Quinoxaline Backbone Subsequently, a solar cell was produced using the polymers synthesized in Examples 1 to 6 and Comparative example 1. The production process will be described with reference to FIG. 1.

First, the solid content of an organic semiconductor to be used as the photoelectric conversion layer 13 was prepared. The p-type organic semiconductor obtained in each of the examples and the comparative example and {6,6}-phenyl-$C_{71}$-butyric acid methyl ester (n-type organic semiconductor) were mixed at a ratio of 40 parts by weight.

Then, 30 mg of the solid content with respect to 1 ml of orthodichlorobenzene (a solvent) was added to a sample bottle and the mixture was dissolved by subjecting it to ultrasonic irradiation at 50° C. for 2 hours using an ultrasonic washing machine to obtain a coating solution K to be used for the photoelectric conversion layer 13. Finally, the coating solution K was filtered with a 0.2-μm filter.

The substrate is a glass substrate having a size of 20 mm×20 mm and a thickness of 0.7 mm. 140 nm of an ITO transparent conductive layer was stacked on the glass substrate by sputtering, and then the ITO portion was patterned into a rectangular form of 3.2 mm×20 mm by the photolithographic method to obtain a glass substrate having the ITO.

The substrate was ultrasonically washed with pure water containing 1% of a surfactant for 5 minutes and then washed with running pure water for 15 minutes. Further, it was ultrasonically washed with acetone for 5 minutes and then with IPA for 5 minutes, followed by drying in a thermostat at 120° C. for 60 minutes. Thereafter, MT-treatment of the substrate was preformed for 10 minutes to allow the surface to be hydrophilic.

The film formation by coating was performed by the following process.

A PEDOT/PSS aqueous solution (poly(3,4-ethylene dioxythiophene)-poly(styrene sulfonate)) was applied to the glass substrate having the ITO in the air by spin coating to form a film having a thickness of 54 nm. The resultant film was heat-dried on the hot plate at 200° C. for 5 minutes to obtain the hole transport layer 14. The PEDOT/PSS aqueous solution pre-filtered with a 0.1-μm filter was used.

Then, the above coating solution K was dropped on the hole transport layer 14 in a nitrogen-substituted glove box, and an organic semiconductor layer having a film thickness of 90 nm was formed by spin coating. Thereafter, in the same atmosphere, the layer was heat-dried on the hot plate at 70° C. for 60 minutes to obtain the photoelectric conversion layer 13. Subsequently, in order to obtain the electron transport layer 15, an amorphous titanium oxide layer was formed with a sol-gel based solution. The sol-gel based titanium oxide solution was pre-produced in the following process. 5 ml of titanium isopropoxide, 25 ml of 2-methoxyethanol, and 2.5 ml of ethanolamine were placed in a nitrogen-substituted 50 ml three-necked flask provided with a stirrer mechanism, a reflux device, and a temperature controller, which was subjected to a reflux treatment at 80° C. for 2 hours and then at 120° C. for 1 hour. The obtained titanium oxide precursor solution was 150-fold diluted with IPA. The solution was pre-filtered with the 0.2-μm filter.

The solution was dropped onto the photoelectric conversion layer 14 by spin coating to form a layer having a thickness of 15 nm. The formed layer was heat-dried on the hot plate at 80° C. for 10 minutes to obtain the electron transport layer 15. The coating of the electron transport layer and the drying processes were performed in the air because the processes were accompanied by the reaction of producing titanium oxide by hydrolysis. The reaction proceeded through the use of water contained in the air.

Then, the negative electrode was formed by vacuum deposition using a vacuum evaporator. More specifically, the glass substrate having the ITO coated with the photoelectric conversion layer was positioned in a substrate holder, a negative electrode pattern mask was laminated on the substrate, and the holder was placed in a vapor-deposition device. The negative electrode pattern mask was arranged such that the ITO layer and the negative electrode pattern were crossed in a rectangular elongate hole with a width of 3.2 mm. Therefore, the organic thin-film solar cell device has an area of the crossed portion, and the area is 0.1024 cm² (3.2 mm×3.2 mm). The vapor deposition condition was set by discharging the air until the degree of vacuum become 3×10⁻⁶ Torr. An aluminum layer was vapor-deposited such that the thickness is 80 nm by resistive heating with use of a wire of Al.

Subsequently, the substrate after the annealing was sealed by adhesion of a seal glass, whose center was cut, with use of an epoxy resin.

Finally, the extraction electrodes each were taken out from the negative electrode and the positive electrode to obtain an organic thin-film photovoltaic cell.

<4> Measurement of Photoelectric Conversion Efficiency

For each organic thin-film solar cell produced by the above method, a photoelectric conversion efficiency r was measured using an electric-power measurement device (MAKI MANUFACTURING CO., LTD.). As the light source for measurement, a standard light source which simulates pseudo-sunlight was used in which the output power having an exposure illumination intensity of 100 mW/cm² was obtained by using a solar simulator for reproducing AM1.5 was obtained. PV characteristics by electronic load were measured with the device to determine the photoelectric conversion efficiency. A photoelectric conversion efficiency η was calculated according to the following formula.

η(%)=open circuit voltage Voc (mV)×short-circuit current density (mAcm⁻²)×FF/irradiation light intensity (mWcm⁻²)

<5> Measurement of HOMO Energy

For each organic thin-film solar cell produced by the method above, the ionization potential and work function were measured using photoelectron yield spectroscopy. Then, HOMO energy was calculated.

TABLE 1

| | HOMO level (eV) | Open voltage (mV) |
|---|---|---|
| Example 1 | 5.41 | 917 |
| Example 2 | 5.77 | 918 |
| Example 3 | 5.73 | 1014 |
| Example 4 | 5.49 | |
| Example 5 | 5.25 | |
| Example 6 | 5.86 | |
| Comparative example 1 | 5.35 | 798 |

The obtained results showed the followings.

As the result of Example 1, the open circuit voltage, the short-circuit current density, the fill factor², and the conversion efficiency were 917 mV, 10.9 mAcm⁻², 0.49 mWcm⁻², and 4.9%, respectively. All parameters were higher than those of Comparative example 1 to be described below. This showed that the use of the polymer containing two different types of quinoxaline backbones allowed the conversion efficiency of the photovoltaic cell to be improved.

In Example 2, the open circuit voltage, the short-circuit current density, the fill factor, and the conversion efficiency were 918 mV, 9.14 mAcm⁻², 0.45 mWcm⁻², and 3.8%, respectively. Thus, in this example, high conversion efficiency was obtained. In the example, in an aromatic ring bonding to a pyrazine portion of quinoxaline, an H atom was substituted by trifluoromethyl (—CF₃) at a para-position with respect to quinoxaline. It was shown that the conversion efficiency of the photovoltaic cell was improved by introducing a substituent including fluorine into the aromatic ring.

In Example 3, the open circuit voltage was 1014 mVd, which is a high value.

Example 5 showed that even in the case of a low molecular weight, a high efficiency was obtained by bonding a condensed ring to a quinoxaline portion. In the example, the open circuit voltage, the short-circuit current density, the fill factor, and the conversion efficiency per repeating unit were 82 mV, 0.87 mAcm⁻², 0.048 mWcm⁻², and 0.25%, respectively. Thus, high conversion efficiency was obtained per repeating unit.

On the other hand, in Comparative example 1, the open circuit voltage, the short-circuit current density, the fill factor, and the conversion efficiency were 798 mV, 9.4 mAcm⁻², 0.42 mWcm⁻², and 3.14%, respectively. All the values were low. Further, the open circuit voltage, the short-circuit current density, the fill factor, and the conversion efficiency per repeating unit were 17.7 mV, 0.21 mAcm⁻², 0.0093 mWcm⁻², and 0.070%, respectively. The conversion efficiency per repeating unit was also low.

In Table 1, when comparing Comparative example 1 with Examples 1, 2, and 3, the HOMO levels were lowered by introducing a fluorine atom into a quinoxaline backbone. It is considered that decreases in the HOMO levels are contributed to the improvement in the open circuit voltage.

Example 7

An organic thin-film solar cell was produced by using a mixture of the polymers of Example 3 and Comparative example 1 as a p-type semiconductor of a photoelectric conversion layer. The polymer of Example 3 and the polymer of Comparative example 1 were mixed at weight ratios of 1:9, 2:8, 3:7, 4:6, 5:5, 6:4, 7:3, 8:2, and 9:1. 70 PCBM([6,6]-phenyl-C₇₁-butyric acid methyl ester), manufactured by FrontierCarbon was used as an n-type organic semiconductor, and the p-type and the n-type semiconductors were mixed at a weight ratio of 1:4 to obtain a solid content of a photoelectric conversion layer.

Then, 24 mg of the solid content with respect to 0.3 ml of a solvent orthodichlorobenzene was added to a sample bottle and the mixture was dissolved at 80° C. for 30 minutes to prepare a coating solution K to be used for the photoelectric conversion layer 13. The coating solution K was filtered with a 0.2-μm filter.

The substrate is a glass substrate having a size of 20 mm×20 mm and a thickness of 0.7 mm. 150 nm of an ITO transparent conductive layer was stacked on the glass substrate by sputtering. The ITO portion was patterned into a rectangular form of 3.2 mm×20 mm by the photolithographic method to obtain a glass substrate having the ITO.

Further, the substrate was ultrasonically washed with acetone for 5 minutes and then with IPA for 5 minutes, followed by drying in a thermostat at 120° C. for 60 minutes. Thereafter, UV-treatment of the substrate was preformed for 10 minutes to allow the surface to be hydrophilic.

The following production process is the same as the above production process, and the measurement method of the photoelectric conversion efficiency is the same as mentioned above. As for each of the cases of varying the ratio of two polymers of the p-type semiconductor layer, the open circuit voltage, the short-circuit current density mAcm⁻², the fill factor, and the conversion efficiency were examined.

When the ratio of the polymer of Example 3 to the polymer of Comparative example 1 was in a range of 3:7 to 1:9, the open circuit voltage, the short-circuit current density, the fill factor, and the photoelectric conversion efficiency were from 3.5 to 3.7 mV, from 1.1 to 1.2 mAcm$^{-2}$, 0.9 mWcm$^{-2}$, and from 4.0% to 4.4%, respectively. Thus, it was found that the photoelectric conversion efficiency was high. Particularly, when the ratio of the polymer of Example 3 to the polymer of Comparative example 1 was 1:9, the photoelectric conversion efficiency was the maximum of 4.4%. Thus, even if the content of the polymer of Example 3 was low, the effect of improving photoelectric conversion efficiency was exhibited.

From the above results, according to these embodiments or the examples, it is shown that a polymer which can improve the photoelectric conversion efficiency of the solar cell can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A copolymer including first and second repeating units different from each other, the first repeating unit including a segment represented by formula (A), and the second repeating unit including a segment represented by formula (B), wherein Ar$^1$, Ar$^2$, Ar$^3$, and Ar$^4$ are identically or differently phenyl or thienyl group in which each H atom may be unsubstituted or substituted by a fluorine atom or a substituent having a fluorine atom, the substituent having a fluorine atom being a linear or branched alkyl group or alkoxy group having 1 to 12 carbon atoms in which one or more of H atoms are substituted by fluorine atoms, and at least one of Ar$^1$, Ar$^2$, Ar$^3$, and Ar$^4$ is phenyl or thienyl group having one or more H atoms substituted by trifluoromethyl groups;

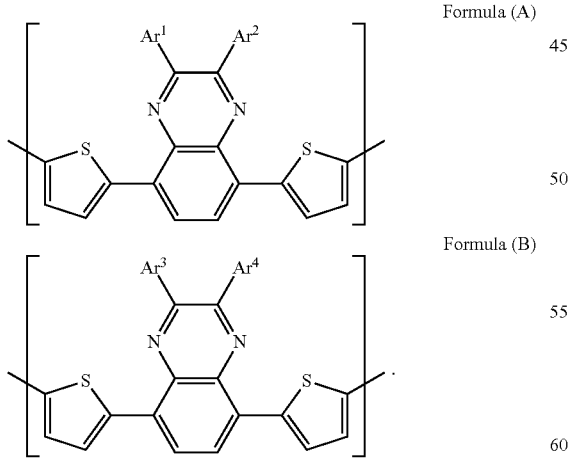

2. A solar cell comprising:
a positive electrode;
a negative electrode; and
a photoelectric conversion layer which is interposed between the positive electrode and the negative electrode and contains a copolymer, the copolymer including first and second repeating units different from each other, the first repeating unit including a segment represented by formula (A), and the second repeating unit including a segment represented by formula (B), wherein Ar$^1$, Ar$^2$, Ar$^3$, and Ar$^4$ are identically or differently phenyl or thienyl group in which each H atom may be unsubstituted or substituted by a fluorine atom or a substituent having a fluorine atom, the substituent having a fluorine atom being a linear or branched alkyl group or alkoxy group having 1 to 12 carbon atoms in which one or more of H atoms are substituted by fluorine atoms, and at least one of Ar$^1$, Ar$^2$, Ar$^3$, and Ar$^4$ is phenyl or thienyl group having one or more H atoms substituted by trifluoromethyl groups:

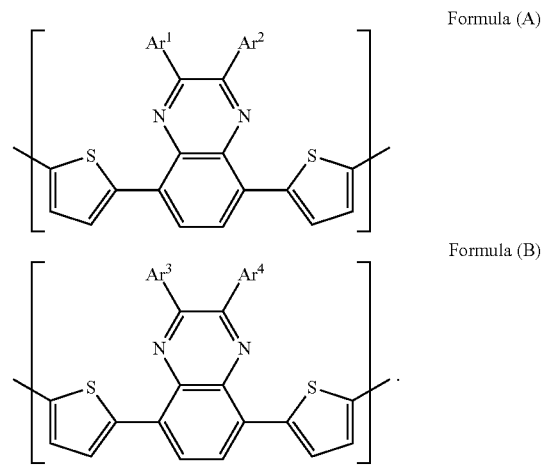

3. A solar photovoltaic generation system comprising:
a solar cell comprising a positive electrode, a negative electrode, and a photoelectric conversion layer which is interposed between the positive electrode and the negative electrode and contains a copolymer, the copolymer including first and second repeating units different from each other, the first repeating unit including a segment represented by formula (A), and the second repeating unit including a segment represented by formula (B), wherein Ar$^1$, Ar$^2$, Ar$^3$, and Ar$^4$ are identically or differently phenyl or thienyl group in which each H atom may be unsubstituted or substituted by a fluorine atom or a substituent having a fluorine atom, the substituent having a fluorine atom being a linear or branched alkyl group or alkoxy group having 1 to 12 carbon atoms in which one or more of H atoms are substituted by fluorine atoms, and at least one of Ar$^1$, Ar$^2$, Ar$^3$, and Ar$^4$ is phenyl or thienyl group having one or more H atoms substituted by trifluoromethyl groups;
an inverter which converts a DC power output from the photovoltaic cell into an AC power; and
a storage cell which stores at least a part of an excessive amount of power when the electric power output from the photovoltaic cell exceeds user's power consumption, and outputs the stored electric power when the electric power output from the photovoltaic cell is below the user's power consumption;

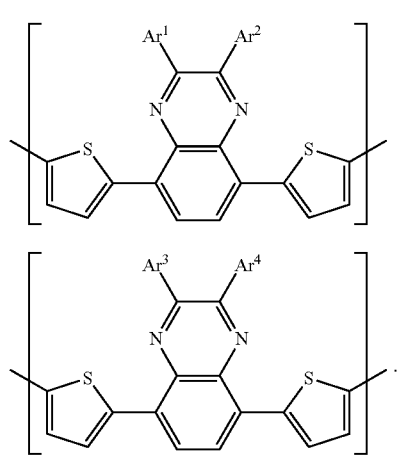
Formula (A)
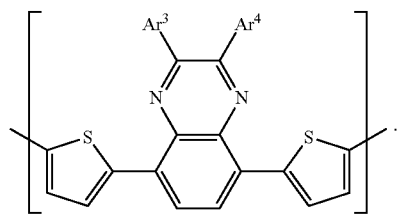
Formula (B)